US005527200A

United States Patent [19]

Lee et al.

[11] Patent Number: 5,527,200

[45] Date of Patent: Jun. 18, 1996

[54] METHOD FOR MAKING A SILICON FIELD EMISSION EMITTER

[75] Inventors: Kang-ok Lee; Cheon-kyu Lee, both of Kyunggi-do, Rep. of Korea

[73] Assignee: Samsung Display Devices Co., Ltd., Kyunggi-do, Rep. of Korea

[21] Appl. No.: 163,818

[22] Filed: Dec. 8, 1993

[30] Foreign Application Priority Data

Dec. 11, 1992 [KR] Rep. of Korea .................... 92-24010

[51] Int. Cl.[6] .............................. H01L 21/46; H01J 9/12

[52] U.S. Cl. .............................................. 445/50; 437/228

[58] Field of Search .................................. 437/225, 228; 156/643; 445/50, 58

[56] References Cited

U.S. PATENT DOCUMENTS

| | | | |
|---|---|---|---|
| 4,095,133 | 6/1978 | Hoeberechis | 313/336 |
| 5,266,530 | 11/1993 | Bagley et al. | 437/228 |
| 5,312,514 | 5/1994 | Kumar | 156/643 |
| 5,389,026 | 2/1995 | Fukata et al. | 445/24 |
| 5,401,676 | 3/1995 | Lee | 437/200 |
| 5,420,054 | 5/1995 | Choi et al. | 437/38 |

FOREIGN PATENT DOCUMENTS 0167326 6/1992 Japan .

OTHER PUBLICATIONS

Wolf, Stanley, 'Si Proc. For The VLSI ERA', vol. II, Lattice Press; Sunset Beach, CA; p. 314.

*Primary Examiner*—R. Bruce Breneman
*Assistant Examiner*—Matthew Whipple
*Attorney, Agent, or Firm*—Christie, Parker & Hale

[57] ABSTRACT

There is disclosed a silicon field emission emitter and a method for making a silicon field emission emitter which has a good electronic characteristic and a simplified making process. The silicon field emission emitter in accordance with the embodiment of the present invention includes a silicon substrate of high density, an insulating layer on the silicon substrate of high density, a cavity formed in the insulating layer, an emitter formed with the silicon substrate of high density in a body in the cavity, and a gate electrode formed on the insulating layer. The insulating layer is made of the thermal oxide film having the thickness of 4000 angstroms and the gate electrode coats the emitter tip.

3 Claims, 3 Drawing Sheets

METHOD FOR MAKING A SILICON FIELD EMISSION EMITTER

BACKGROUND OF THE INVENTION (1) Field of the Invention

The present invention relates to a silicon field emission emitter and method for manufacturing the same. The silicon field emission emitter may be utilized as an electron sources in various displays, light source, amplifying devices, high speed switching devices, a microsensor and so on.

(2) Description of the Prior Art

Recently, attention is concentrated on an inefficient thermionic emitter that is substituted for a high field emission emitter. The emitter is very efficient since an emitter material does not need to be heated. The emitter has been used for scanning sources of an electron microscope for several years, and the emitter is now being developed as a source for a vacuum microelectron device, a flat panel display, and a high efficiency and frequency vacuum tube.

The field emission emitter may have very high luminous efficiency and luminescence by making a point of the field emission material of which a radius is less than about 100 nanometers high-integrated to $10^4$–$10^5$ Tips/$mm^2$, and thus is thought as a very suitable display device for the embodiment of wall television sets owing to a low voltage consumption.

Besides, even though silicon has a low melting point and electric conductivity, the applicability is gradually increased by the variety of the microfabrication technology that can facilitate fabrication of sharp emitter tips by means of silicon.

FIG. 1 illustrates a preferred embodiment of a typical structure of the silicon field emission emitter. A reference numeral, 11 indicates a silicon substrate doped with impurities of high density and having high conductivity. Also, a cone-shaped emitter 17 is formed within a cavity 15 in an insulating layer 13 on the silicon substrate 11. And a gate electrode 19 made of a molybdenum thin film is deposited on an insulting layer 13.

FIG. 2 shows a perspective view of a prior art display using the field emission emitter as the electron sources ( Refer to Japan Patent Unexamined Publication Sho 61-221783).

Referring to FIG. 2, an emitter electrode 21 doped with impurities of high density is formed on the silicon substrate 20 in accordance with the directions of columns 22, and a cone-shaped field emission emitter 26 and an insulting layer 23 is formed on the emitter electrode 21. Also, a plurality of gate electrodes 25 is formed on the insulting layer 23 in accordance with the directions of rows 24. Cavities or holes 15 are formed at the opposite side of the cone-shaped field emission emitter 26 of the gate electrode 25.

Meantime, on an upper substrate 27, a transparent conductive layer 29 and a fluorescent layer 28 are respectively deposited to be fixed to the upper substrate 27 in a beta configuration. The lower substrate 20 and the upper substrate 27 together with a spacer (not shown) form an outside of a vacuum tube.

The operation of the above-mentioned display is as follows:

Positive electric potential is applied to the transparent conductive layer 29. Responsive to a display signal, predetermined electric potential difference is given between the emitter electrode 21 in the columns 22 and the gate electrode 25 in the rows 24. An appropriate electric field is formed between the gate electrode 25 and the cone-shaped field emission emitter 26, such that electrons are emitted from a cone-shaped tip. The electron is emitted from the cavity 15 of the gate electrode 25 to the fluorescent layer 28, then the fluorescent layer 28 radiates.

For example, by biasing the gate electrodes 25 within the range of several tens voltages to several hundreds voltages to the substrate 20, the electronic field is generated between the cone-shaped microtip emitters 26 and the gate electrodes 25, and emission current of about several mA is obtained from the tip of the emitters 26.

An image in accordance with the display signal is displayed by the above-mentioned operation.

The prior art silicon field emission emitters have some disadvantages in forming the insulating layer 13 and the gate electrode 19. Since the insulating layer 13 is generally formed by inclination deposition using an electron beam evaporator, the characteristic of the insulating layer is bad and a breakdown voltage value of the deposited film is less than 4 MV/cm. Accordingly, there are disadvantages that the thickness of the insulating layer should be limited to more than one micrometers, a making process is complicated and it takes longer to make the emitter to keep a safe breakdown voltage value by a high field formed between upper and lower electrodes. In addition, another disadvantage is that it takes longer for the emitter and applied voltage to become higher because the diameter of the cavity 15 becomes wider in forming the gate electrode by inclination deposition using an electron beam evaporator.

SUMMARY OF THE INVENTION

Accordingly, the present invention is directed to an emitter which substantially obviates one or more of the problems due to limitations and disadvantages of the prior art. The present invention is directed to a silicon field emission emitter and a method for making a silicon field emission emitter which has a good electronic characteristic and a simplified making process.

To achieve this and other advantages in accordance with the purpose of the invention, as embodied and broadly described herein, in a variation, a silicon field emission emitter comprises a conductive substrate doped with impurities of high density, an emitter having a conical shape and formed with said substrate in a body, a thermal oxide film of $SiO_2$ formed on said substrate to coat said cone-shaped emitter and to make a tip of an emitter be exposed, and a gate electrode formed on said thermal oxide films of $SiO_2$ and for surrounding the exposed emitter to form a cavity between said exposed emitter and the gate electrode approximately at the same level as the level of said exposed emitter.

In another variation, a method for making a silicon field emission emitter comprising the steps of forming a thermal oxide mask by photo etching after oxidation of a highly doped silicon substrate, etching the silicon substrate to form a cone-shaped emitter by using the thermal oxide mask, sharpening the emitter having a plane tip be pointed and forming a thin thermal oxide film serving as an insulating layer, depositing to form a gate electrode to surround the emitter tip by sputtering on the thermal oxide film, and wet etching to expose the tip of the cone-shaped emitter.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one embodiment of the invention and together with the description, serve to explain the principles of the invention.

DETAILED DESCRIPTION OF THE PREFERRED EMBODIMENT

Figure 1:
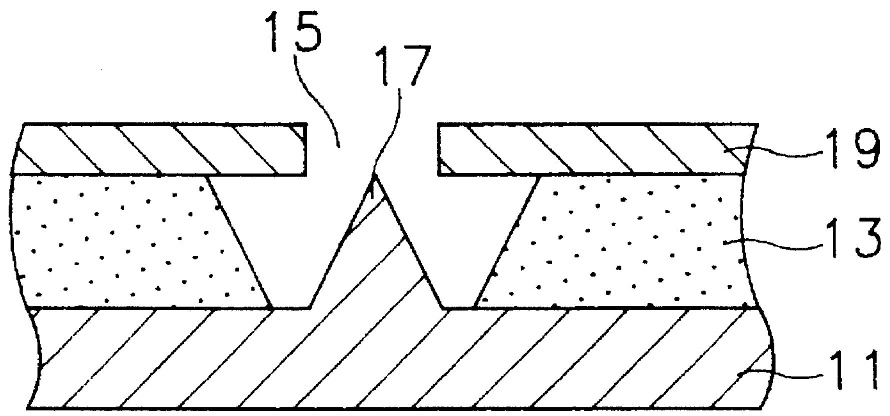
FIG.1 (Prior Art)
FIG. 1 is a sectional view illustrating a structure of a prior art silicon field emission emitter.
Figure 2:
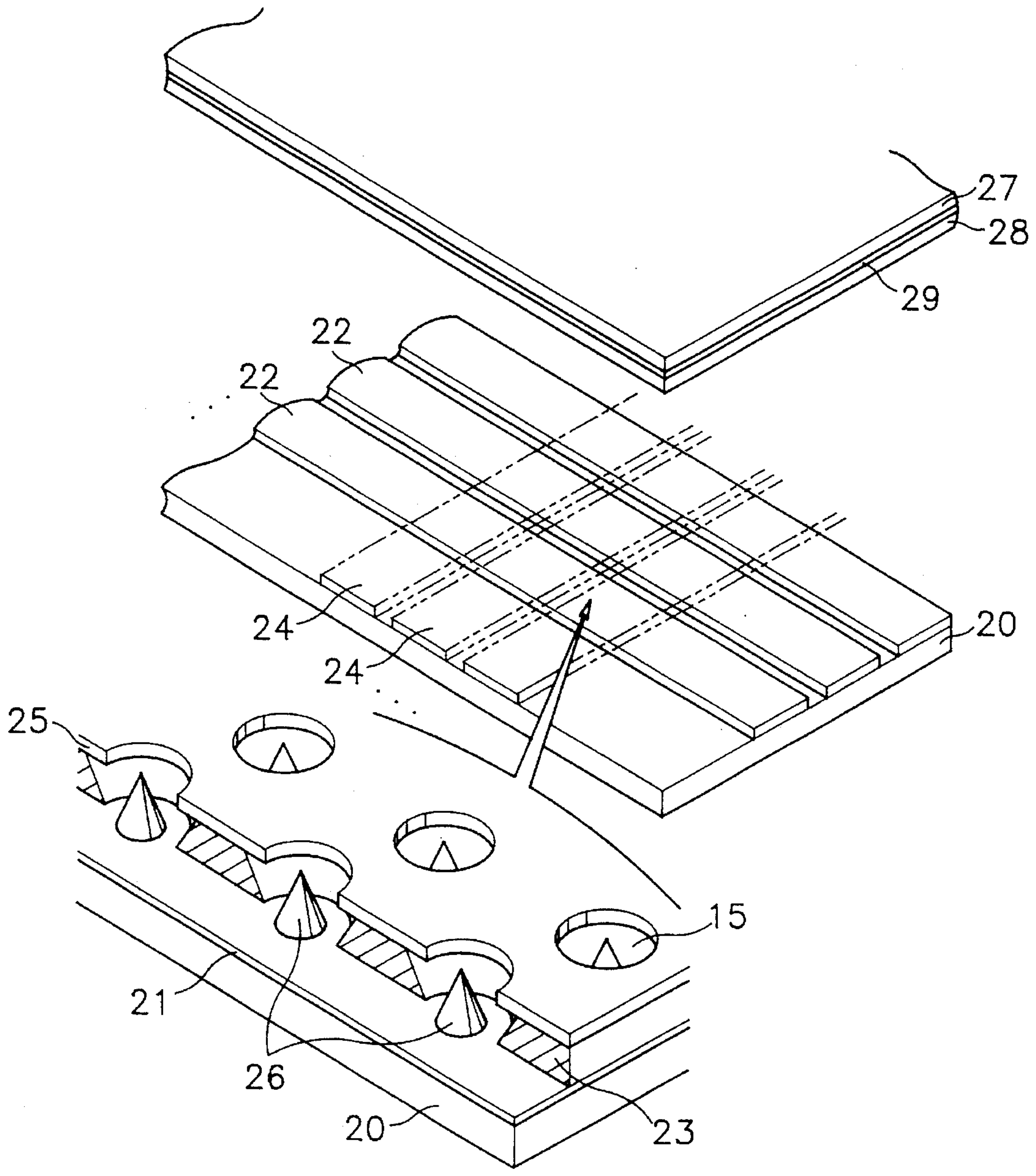
FIG.2 (Prior Art)
FIG. 2 is a view illustrating a structure of display device using the silicon field emission emitter shown in FIG. 1.
Figure 3A:
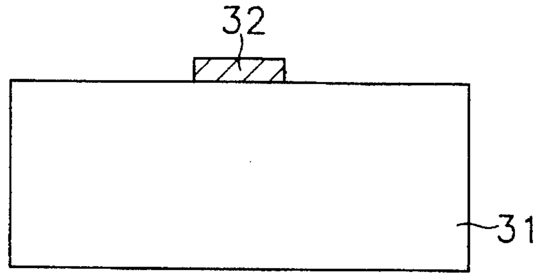
FIGS. 3A to 3E are sectional views illustrating steps for making a silicon field emission emitter in accordance with the embodiment of the present invention.
Figure 3B:
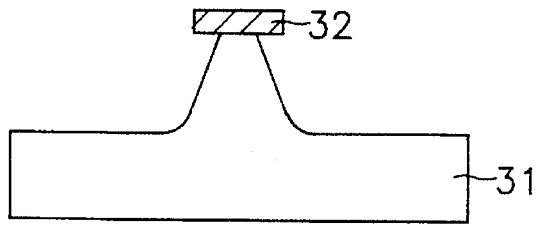
Figure 3C:
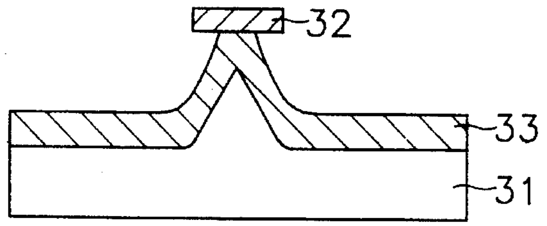
Figure 3D:
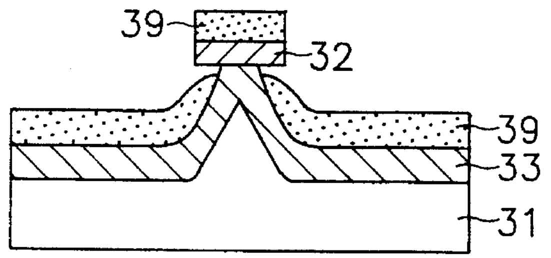
Figure 3E:
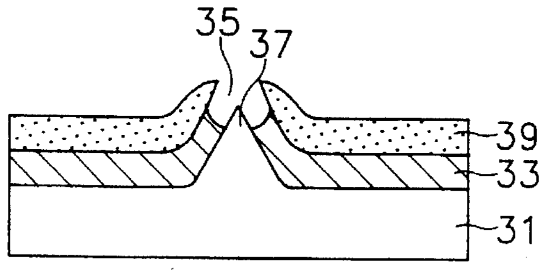

Referring to FIG. 3E, a silicon field emission emitter in accordance with the embodiment of the present invention includes a silicon substrate 31 doped with impurities of high density, an insulating layer 33 on the silicon substrate 31 of high density, a cavity 35 formed in the insulating layer 33, an emitter 37 formed with the silicon substrate 31 of high density together in a body in the cavity 35, and a gate electrode 39 formed on the insulating layer 33. The insulating layer 33 is made of a thermal oxide film of about 4000 angstroms and the gate electrode 39 surrounds the emitter tip 37.

FIGS. 3A to 3E are sectional views illustrating the steps for making a silicon field emission emitter in accordance with the embodiment of the present invention.

A first step is forming an oxide mask 32 (FIG. 3A). A single crystalline substrate 31, e.g., a highly doped N-type silicon substrate having resistivity of several Ω-cm is thermally oxidized to form an oxide film of about 1200 to 1500 angstroms, and the oxide mask 32 for self-alignment at the time of the following etching and depositing process is then formed through photo-etching.

A second step is etching the silicon substrate by reactive ion etching to allow control of the emitter aspect ratio and form cone-shaped emitter by means of the oxide mask 32 (FIG. 3B). The single crystalline substrate 31 under the oxide mask 32 is selectively etched in the horizontal and vertical directions at a predetermined rate as shown in FIG. 3B. The configuration of the silicon emitter having the sharp edge or tip of the conical structure is determined by the selective etch rate and the shape of the mask.

A third step is forming a $SiO_2$ oxide film 33 by thermal oxidation, dry oxidation, wet oxidation and so on. The emitter having a plan tip is sharpened through the oxidation process, and at the same time a thin thermal oxide film is formed to serve as an insulating layer through the oxidation of the substrate 31. A breakdown voltage value of the oxide film 33 using a Si thermal oxidation process is 6.8 to 9 MV/cm, which is twice as high as voltage of a deposition film using an electron beam evaporator. In addition, the oxide film has smaller leakage current than the prior art deposition film. Accordingly, the oxide film is half as thick as the insulating layer by the prior art deposition, and it takes shorter time to make the emitter. The thickness of the $SiO_2$ thermal oxide film can be reduced to about 4000 angstroms. Referring to FIG. 3C, a profile of the Si thermal-oxide film 33 is the same as a selective etching profile, and in the following process, the thermal oxide film 33 is removed and the sharp tip profile of the silicon emitter remains.

A fourth step is forming a gate electrode 39 by depositing a gate metal, for example, Mo, Cr and the like by sputtering on the $SiO_2$ thermal oxide film to coat the emitter tip wherein the mask and the emitter are not completely encapsulated by the gate metal (FIG. 3D). The gate electrode 39 formed by sputtering deposition overcomes the disadvantage that a diameter of a gate hole widens in an inclination deposition using the electron beam evaporator of the prior art. Also, the applied voltage to the gate electrode 39 may become lower since the gate electrode 39 is formed to surround the emitter tip.

The final step is a wet etching process to remove the oxide mask 32 and the lower oxide film 33, and then a silicon field emission emitter of the present invention 25 is formed as shown in FIG. 3E.

On the other hand, a process for making an upper substrate is as follows:

First, a transparent conductive layer having a thickness of about 2000 to 3000 angstroms to which a positive electric potential is applied and is deposited by sputtering. Then a phosphor layer is formed by depositing the phosphor (ZnO:Zn) by screen printing for forming a thick film or slurry. At this time, a green phosphor ($Zn_{0.65}Cd_{0.35}S$:Ag,Cl), a yellow phosphor ($Zn_{0.2}Cd_{0.8}S$:Ag, Cl) and a blue phosphor (ZnS:Ag,Cl) are respectively used when applied to colour display. Spacers are formed by the thick film screen printing to leave about 200 micro meters space between a surface of the phosphor layer and the surface of the gate electrode 39. After that, the upper, lower substrate and spacers are fixedly attached to one another by using a frit paste, and the frit is melted to attach by heat. A high vacuum of less than $1.0\times10^{-6}$Torr is produced inside of a pipe attached by the above-mentioned process through an exhaust pipe. Then, when the inside of the panel is electrically connected to a circuit driver on the outside of the panel, the formation of an electron emission display finishes.

The operation of the electron emission display made by the above-mentioned process is as follows:

Responsive to display signals, predetermined electric potential difference is given between a plurality of emitters in accordance with the directions of the columns and a plurality of gates in accordance with the directions of the rows, and a pixel or a cone-shaped field emission emitter is driven in a matrix, so that the electron emitted from the necessary pixel is struck to emit light to the opposite phosphor layer and then an image in accordance with the display signal is displayed. At this point, the electric potential difference between the gates and the emitters is generally around 40 volts, and about 200 volts is applied to the transparent conductive layer.

As described above, the present invention has advantages that the insulating layer for keeping the predetermined space between the emitter electrode and the gate electrode is formed to the thermal oxide film by the thermal oxidation of the silicon substrate without using the additional deposition, such that the making process is simplified, productivity is improved, and the thickness of the insulating layer can be reduced from 1 micrometer to 0.4 micrometer by increasing the breakdown voltage to about 100 percent. Also, a gate aperture can be minimized because the gate electrode is formed to surround the emitter tip by the sputtering.

What is claimed is:

1. A method for making a silicon filed emission emitter comprising the steps of:

forming a thermal oxide mask on a surface of a doped silicon substrate by photo etching after oxidation of the substrate;

etching the silicon substrate to form a cone-shaped emitter having a planar tip by using said thermal oxide mask;

sharpening the planar tip of said emitter by forming a thin thermal oxide film on the silicon substrate serving as an insulating layer;

depositing a gate metal onto an upper surface of the mask and onto the upper surface of said insulating layer, wherein the gate metal extends along the upper surface to a wall portion of said emitter to form a gate electrode, and wherein the mask and the emitter are not completely encapsulated by the gate metal; and wet etching the insulating layer to expose the tip of the cone-shaped emitter.

2. The method of claim 1, wherein the thickness of said thin thermal oxide film formed through thermal oxidation process is 4000 angstroms.

3. The method as recited in claim 1 comprising depositing the gate metal by sputtering.

* * * * *